United States Patent
Lenski et al.

(10) Patent No.: US 7,528,026 B2
(45) Date of Patent: May 5, 2009

(54) METHOD FOR REDUCING SILICIDE DEFECTS BY REMOVING CONTAMINANTS PRIOR TO DRAIN/SOURCE ACTIVATION

(75) Inventors: Markus Lenski, Dresden (DE); Ralf Van Bentum, Moritzburg (DE); Ekkehard Pruefer, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 140 days.

(21) Appl. No.: 11/567,802

(22) Filed: Dec. 7, 2006

(65) Prior Publication Data

US 2007/0254437 A1 Nov. 1, 2007

(30) Foreign Application Priority Data

Apr. 28, 2006 (DE) .................. 10 2006 019 836

(51) Int. Cl.
*H01L 21/337* (2006.01)
(52) U.S. Cl. .................. 438/194; 438/195; 438/223; 438/275; 257/E21.247; 257/E21.316
(58) Field of Classification Search .................. 438/223, 438/174, 176, 181, 194, 195, 491; 257/E21.085, 257/E21.147, E21.177, E21.247, E21.315, 257/E21.4, E21.491
See application file for complete search history.

(56) References Cited

U.S. PATENT DOCUMENTS

| 6,238,959 B1 * | 5/2001 | Tung | 438/197 |
| 2004/0046212 A1 * | 3/2004 | Takahashi | 257/390 |
| 2004/0224450 A1 * | 11/2004 | Itonaga et al. | 438/197 |

FOREIGN PATENT DOCUMENTS

| DE | 102 14 065 A1 | 10/2003 | 21/336 |
| DE | 601 02 775 T2 | 5/2005 | 21/306 |

* cited by examiner

*Primary Examiner*—Walter L Lindsay, Jr.
*Assistant Examiner*—Cheung Lee
(74) *Attorney, Agent, or Firm*—Williams, Morgan & Amerson, P.C.

(57) ABSTRACT

By consuming a surface portion of polysilicon material or silicon material after implantation and prior to activation of dopants, contaminants may be efficiently removed, thereby significantly enhancing the process uniformity during a subsequent silicidation process. Hence, the defect rate during the silicidation process, for instance "missing silicide" defects, may be significantly reduced, thereby also enhancing the reliability of static RAM cells.

16 Claims, 4 Drawing Sheets

METHOD FOR REDUCING SILICIDE DEFECTS BY REMOVING CONTAMINANTS PRIOR TO DRAIN/SOURCE ACTIVATION

BACKGROUND OF THE INVENTION

1. Field of the Invention

Generally, the present invention relates to the field of fabrication of integrated circuits, and, more particularly, to semiconductor devices having metal-silicide portions on highly doped semiconductor regions, such as polysilicon lines, drain and source regions and the like, to reduce the resistance of the semiconductor regions.

2. Description of the Related Art

In modern ultra-high density integrated circuits, device features are steadily decreasing to enhance device performance and functionality. Shrinking the feature sizes, however, entails certain problems that may partially offset the advantages obtained by the reduced feature sizes. Generally, reducing the feature sizes of, for example, a transistor element may lead to a decreased channel resistance in the transistor element and thus result in a higher drive current capability and enhanced switching speed of the transistor. In decreasing the features sizes of these transistor elements, however, the increasing electrical resistance of conductive lines, such as the gate electrodes or other polysilicon lines and contact regions, i.e., regions that connect transistor areas, such as drain and source regions, with the periphery of the transistor element, becomes a dominant issue since the cross-sectional area of these lines and regions decreases with decreasing feature sizes. The cross-sectional area, however, determines, in combination with the characteristics of the material comprising the conductive lines and contact regions, the resistance thereof.

The above problems may be exemplified for a typical critical feature size in this respect, also referred to as a critical dimension (CD), such as the length of the channel of a field effect transistor that forms below a gate electrode between a source region and a drain region of the transistor. Reducing the channel length may significantly improve device performance with respect to fall and rise times when operating the transistor element in a switched mode due to the reduced capacitance between the gate electrode and the channel and due to the decreased resistance of the shorter channel. Shrinking of the channel length, however, also entails the reduction in size of any conductive lines, such as the gate electrode of the field effect transistor, which is commonly formed of polysilicon, and the contact regions that allow electrical contact to the drain and source regions of the transistor. Consequently, the available cross-section for charge carrier transportation is reduced. As a result, the conductive lines and contact regions exhibit a higher resistance unless the reduced cross-section is compensated for by improving the electrical characteristics of the material forming the lines and contact regions, such as the gate electrode and the drain and source contact regions.

It is thus of particular importance to improve the characteristics of conductive regions that are substantially comprised of semiconductor material such as silicon. For instance, in modern integrated circuits, the individual semiconductor devices, such as field effect transistors, capacitors and the like, are primarily based on silicon, wherein the individual devices are connected by silicon lines and metal lines. While the resistivity of the metal lines may be improved by replacing the commonly used aluminum by, for example, copper and copper alloys, process engineers are confronted with a challenging task when an improvement in the electrical characteristics of silicon-containing semiconductor lines and semiconductor contact regions is required. Thus, a highly conductive metal silicide is formed in polysilicon lines, such as gate electrodes and the drain and source regions, since the metal silicide typically exhibits a significantly higher conductivity compared to polysilicon and crystalline silicon even when highly doped. In conventional techniques, a plurality of highly sophisticated silicidation schemes are employed in order to provide the desired electrical characteristics. For example, refractory metals, such as nickel, platinum, cobalt, titanium, tungsten and the like, or combinations thereof, may be used for increasing the conductivity of polysilicon lines and contact regions. Irrespective of the specific silicidation regime used, the process is typically performed after completing the transistor devices, i.e., after performing any high temperature anneal processes for activating dopants in the drain and source regions and reducing implantation-induced lattice damage, since the conductive metal silicide materials are typically unstable at elevated temperatures as required for the dopant activation.

Although sophisticated silicidation processes are available, it turns out that, in advanced semiconductor devices, a certain type of defects may be observed at critical device locations, in which highly doped regions of different conductivity type are located next to each other. For instance, polysilicon lines may connect transistor elements or other circuit elements, for instance, a common gate polysilicon line may be formed so as to connect two or more different transistor elements, wherein, due to a different conductivity type of the respective transistors, the corresponding polysilicon line may have a highly N-doped portion and a highly P-doped portion. In the vicinity of the corresponding interface of these highly inversely doped regions, a reduced or even missing metal silicide may be observed after the silicidation process, thereby resulting in a corresponding device failure due to the significantly enhanced resistivity of the respective polysilicon line. With reference to FIG. 1a-1e, the problems involved in sophisticated silicidation processes may now be described in more detail.

Figure 1A:
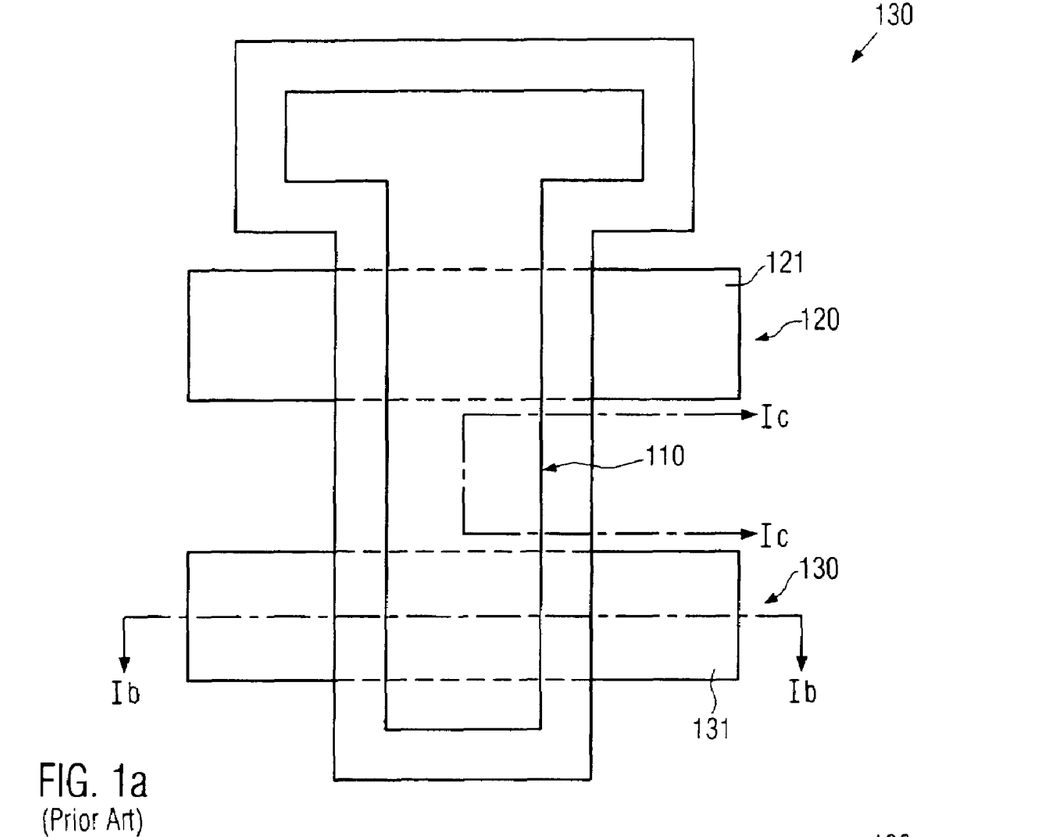
FIG. 1a schematically illustrates a plan view of a semiconductor device comprising a polysilicon line including inversely doped portions.

FIG. 1a schematically illustrates a plan view of a portion of a semiconductor device 100, which may comprise a polysilicon line 110 connecting to, for instance, circuit elements 120 and 130. For instance, the circuit elements 120, 130 may represent transistor elements, wherein the polysilicon line 110 may act as a gate electrode to control a channel region formed below the gate electrode 110 and laterally separating respective drain and source regions 121 in the transistor 120 and drain and source regions 131 in the transistor 130. In some configurations, the first and second transistor elements 120, 130 may represent transistors of different conductivity type, thereby requiring a different dopant material in the respective drain and source regions 121, 131 and thus in the respective portions of the polysilicon line 110. For instance, a corresponding circuit configuration in which a polysilicon line may connect different transistor elements may frequently be used in conventional static RAM cells, in which typically up to six transistor elements may form a single bit of a corresponding memory device.

Figure 1B:
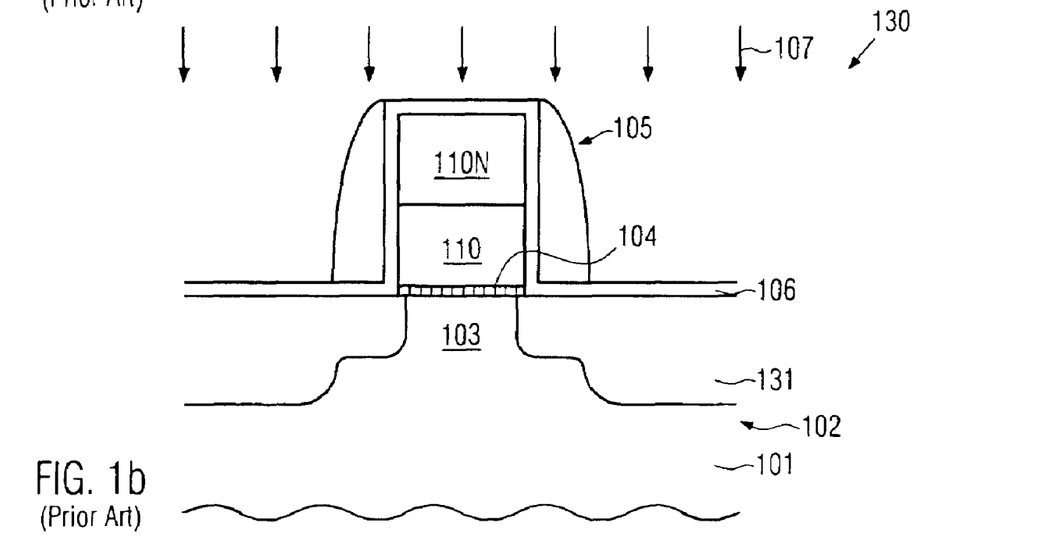
FIG. 1b schematically illustrates a cross-sectional view of a transistor element of the device of FIG. 1a during a specific manufacturing stage in accordance with a conventional process flow.

FIG. 1b schematically illustrates a cross-sectional view along the section 1b as illustrated in FIG. 1a. In this manufacturing stage, the transistor 130 may comprise a substrate 101, which may represent any appropriate carrier material, such as a bulk silicon substrate, a silicon-on-insulator (SOI) substrate and the like. Irrespective of the type of substrate used, a silicon-containing semiconductor layer 102 is formed above the substrate 101 in order to form the respective drain and source regions 131, 121, for instance on the basis of an ion implantation process 107N. When the transistor 130 represents a P-channel transistor, the drain and source regions 131 may have formed therein a high concentration of a P-type dopant, while when representing an N-channel transistor, a high concentration of N-type dopant may be provided in the drain and source regions 131. Similarly, a highly doped portion 110N may also be formed in the polysilicon line 110, which, in this section of the semiconductor device 100, acts as a gate electrode and is formed on a corresponding gate insulation layer 104, which may be comprised of silicon dioxide, silicon nitride or any other appropriate material. Furthermore, a sidewall spacer structure 105 may be formed on sidewalls of the gate electrode or polysilicon line 110 and a capping layer or liner 106 may be formed, for instance as a silicon dioxide liner, on exposed surface portions of silicon-containing materials, such as the drain and source regions 131 and the polysilicon line 110. It should be appreciated that the transistor 120 may have a similar configuration while, as previously explained, the respective drain and source regions 121 may be inversely doped compared to the drain and source regions 131, and similarly the polysilicon line 110 in the vicinity of the transistor 120 may be inversely doped compared to the portion as shown in FIG. 1b.

A typical process flow for forming the semiconductor device 100 as shown in FIGS. 1a and 1b may comprise the following processes. After providing the substrate 101 having formed thereon the silicon-containing semiconductor layer 102, respective transistor areas and areas for other circuit elements requiring doped semiconductor material in the layer 102 may be defined on the basis of well-established isolation techniques. For instance, in advanced applications, trench isolations are typically formed on the basis of advanced photolithography, etch, deposition and planarization processes. For convenience, any such isolation structures are not shown in FIGS. 1a and 1b, wherein it should be appreciated that portions of the polysilicon line 110 may be formed above corresponding isolation structures. Thereafter, respective implantation processes may be performed to provide the required vertical dopant concentration within the respective active semiconductor areas in the layer 102, such as P-wells, N-wells and the like. Next, appropriate materials for the gate insulation layers 104 and the gate electrodes, i.e., polysilicon line 110, may be provided by oxidation and/or deposition, followed by sophisticated patterning techniques on the basis of photolithography and anisotropic etch techniques. Moreover, after patterning the polysilicon line 110 and the gate insulation layers 104, other manufacturing processes may be performed, such as the introduction of strained semiconductor material within respective transistor areas and the like, when advanced strained transistor architectures are considered. Moreover, after the patterning of the polysilicon line 110, appropriate implantation processes may be performed to create a desired lateral dopant profile in the drain and source regions 131, wherein intermittently the sidewall spacers 105 and the liner 106 may be formed. For instance, the final implantation step 107 may be performed on the basis of the sidewall spacer structure 105 and the liner 106 in order to complete the drain and source regions 131, wherein a respective resist mask may cover the transistor 120 so that an appropriate dopant species may be introduced in the drain and source regions 121 of this transistor after forming the drain and source regions 131. During the implantation 107N, the high dopant concentration is also introduced into the upper portion of the polysilicon line 110, that is, in a portion of the line 110 associated with the transistor 130, thereby creating the portion 110N.

Figure 1C:
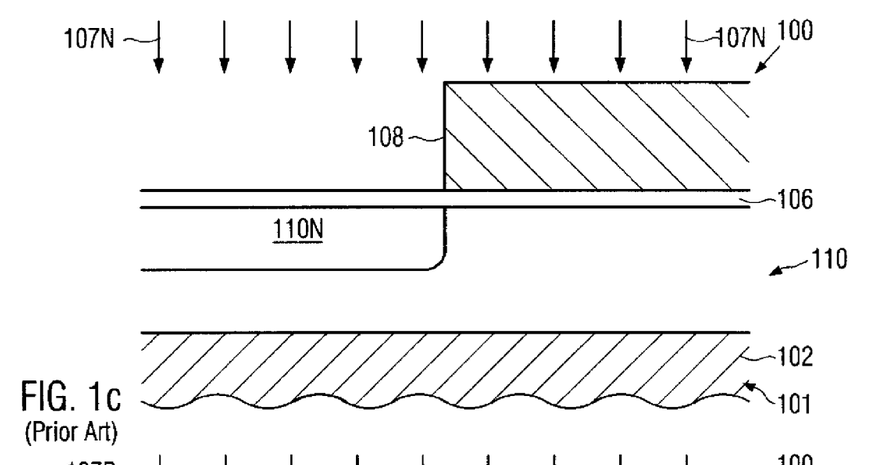

FIG. 1c schematically illustrates a portion of the device 100 corresponding to the sectional view as indicated by the line Ic in FIG. 1a during the ion implantation process 107N. A corresponding resist mask 108 is formed above the transistor 120 and a portion of the polysilicon line 110, while the transistor 130 and the associated portion of the polysilicon line 110 is exposed, thereby creating the highly doped portion 110N. For instance, it may be assumed that the portion 110N is highly N-doped.

Figure 1D:
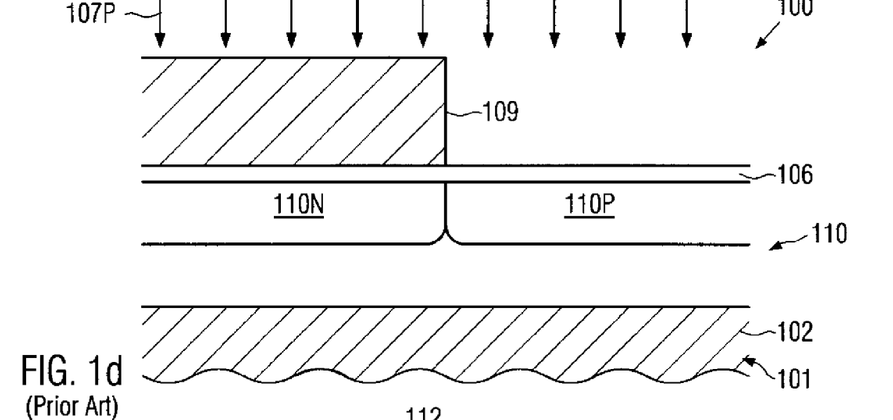

FIG. 1d schematically illustrates the semiconductor device 100 during a further implantation process 107P, during which the transistor 130 may be covered by a resist mask 109, while exposing the transistor 120 and the respective portion of the polysilicon line 110. Hence, during the implantation 107P, a highly P-doped portion 110P is formed.

Thereafter, an appropriate anneal process may be performed in order to activate the dopants in the respective drain and source regions 121 and 131 and also to re-crystallize, at least to a certain degree, implantation-induced damage in the regions 131 and 121. Next, the oxide liner 106 may be removed, for instance on the basis of highly selective wet chemical etch recipes, such as diluted hydrofluoric acid (HF), and subsequently an appropriate silicidation process sequence may be performed. For this purpose, any appropriate cleaning processes may be performed and thereafter any appropriate refractory metal, such as cobalt, nickel, platinum and the like, may be deposited and may be converted into metal silicide on the basis of an appropriately designed heat treatment. After the chemical reaction, which may include a plurality of intermediate process steps, depending on the type of metal silicide to be formed, further stabilization treatments may be carried out, wherein it should be appreciated that typically respective metal silicides may not be stable at elevated temperatures or may exhibit non-desired characteristics after having experienced elevated temperatures. For this reason, the anneal process for activating the dopants in the drain and source regions 131, 121 is to be performed prior to the respective silicidation process.

Figure 1E:
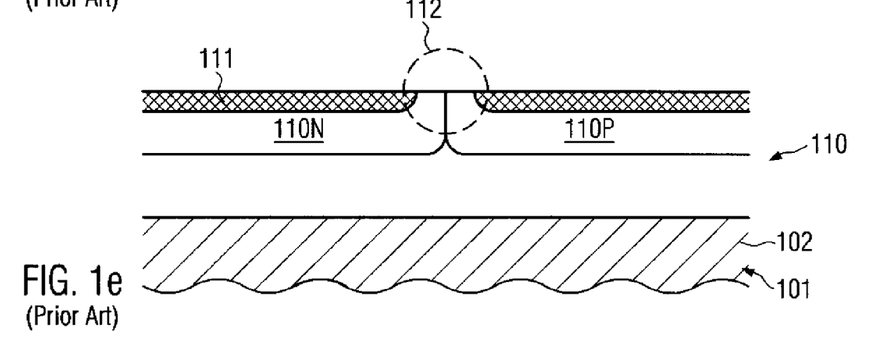

FIG. 1e schematically illustrates the device 100 after the completion of the silicidation process, wherein respective metal silicide regions 111 are formed in the highly doped portions 110N and 110P. However, a high probability for silicide defects may be observed for advanced semiconductor devices, in particular at an area 112 corresponding to the interface between the portions 110N, 110P. In some cases, the respective metal silicide 111 may even be completely missing in the area 112. At any rate, the conductivity of the polysilicon line 110, which substantially relies on the high conductivity of the metal silicide 111, may be significantly degraded due to silicide irregularities, especially in the area 112, which may result in a performance reduction or even a complete failure of the device 100, in particular when the polysilicon line 110 is used as an interconnect in static RAM cells.

The present invention is directed to various methods and systems that may solve, or at least reduce, some or all of the aforementioned problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique for the formation of metal silicide regions in semiconductor areas and in polysilicon lines with a reduced defect rate by providing an additional mechanism for removing contaminants or other irregularities prior to performing a high temperature treatment, such as an anneal process for activating dopants in transistor areas. Consequently, by means of the additional removal process for contaminants prior to a high temperature treatment, an unwanted modification of surface irregularities and other non-uniformities, which may result in an unwanted temperature-driven "consolidation" of such irregularities prior to and during the silicidation process, the probability for missing silicide defects may be significantly reduced, in particular in regions of abutting, highly inversely doped polysilicon portions.

According to one illustrative embodiment of the present invention, a method comprises forming doped areas in a silicon-containing semiconductor region that is covered by a dielectric layer. Next, the dielectric layer is removed and a sacrificial liner is formed on the silicon-containing semiconductor region. Furthermore, the silicon-containing semiconductor region is annealed to activate dopants and the sacrificial liner is removed. Finally, a metal silicide is formed in the silicon-containing semiconductor region.

According to another illustrative embodiment of the present invention, a method comprises doping a silicon-containing semiconductor region and oxidizing a surface portion of the doped silicon-containing semiconductor region to form a sacrificial liner thereon. Furthermore, the sacrificial liner is removed and metal silicide is formed in the silicon-containing semiconductor region.

BRIEF DESCRIPTION OF THE DRAWINGS

The invention may be understood by reference to the following description taken in conjunction with the accompanying drawings, in which like reference numerals identify like elements, and in which:

FIGS. 1c-1e schematically illustrate a cross-sectional view of a portion of the polysilicon line during the formation of metal silicide therein in accordance with a conventional process flow for the device of FIG. 1a.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention relates to a technique for forming metal silicide regions, such as nickel silicide, cobalt silicide, platinum silicide, combinations thereof and the like, on circuit elements of integrated circuits, in particular in highly scaled integrated circuits having critical dimensions, i.e., a gate length of 100 nm and even significantly less, wherein the corresponding silicidation process flow may be performed with enhanced uniformity, thereby also reducing the probability for creating silicide defects, such as "missing silicide," particularly in regions of abutting polysilicon regions of high doping levels. For this purpose, the removal of contaminants may be enhanced prior to the silicidation process and, in some illustrative embodiments, prior to a high temperature treatment, such as the anneal process for activating dopants, in order to provide a substantially undisturbed diffusion of metal and silicon during the respective silicidation process.

Without intending to restrict the present invention to the following explanation, it is believed that carbon-based contaminations may be created during the conventional process flow, in particular in the vicinity of an area where two highly doped polysilicon portions form an interface, wherein the characteristics of the respective carbon-based contaminants may be modified during the high temperature anneal process for activating the dopants, thereby resulting in a high etch resistivity of this modified contaminant during a subsequent process for removing the oxide liner that protects the respective silicon surfaces during the previous process steps. Thus, by implementing an efficient process for removing or at least "neutralizing" the respective irregularities or contaminants prior to the high temperature treatment, a more efficient metal and silicon diffusion during the following silicidation process may be achieved. It is believed that corresponding contaminants, such as carbon and the like, may be created during previous implantation processes on the basis of photoresist material, wherein residues thereof may result in a certain degree of sputtering of carbon on and into the oxide liner, wherein corresponding events may particularly occur in the vicinity of respective resist boundaries as are typically encountered during the implantation sequence for forming the highly doped drain and source regions, during which the respective highly doped regions in the polysilicon portions are also created. Irrespective of the actual origin of the respective contaminants and their exact nature, it is assumed that a corresponding thin contamination layer may form, especially at the specified surface portions of the polysilicon line, which may significantly alter its characteristics during a high temperature treatment, thereby resulting in a non-removable or less efficiently removable species during the subsequent removal of the oxide liner.

Consequently, in some illustrative embodiments, the removal or "deactivation" of the contaminants may be performed under process conditions including a temperature of approximately 500° C. and significantly less in order to substantially avoid a significant alteration of the characteristics of the contaminants. In one illustrative embodiment, a respective liner material, used during the previous process steps, such as implantation, may be removed prior to the dopant activation, and an additional sacrificial layer may be formed on the basis of a process in which a specific amount of silicon is consumed from the polysilicon material, thereby "embedding" any residues of the contaminants that may still be present on the exposed polysilicon surface after the removal of the previously used liner material. For this purpose, in some illustrative embodiments, an appropriately designed oxidation process may be performed, wherein moderately low process temperatures are used in order to "incorporate" residual contaminants. Thereafter, the process flow may be continued by activating the dopant and then removing the sacrificial liner material. The subsequent silicidation process, irrespective of the specifics of this process, may be performed on the basis of a silicon-containing surface that provides a more uniform diffusion behavior and thus may result in a significantly reduced probability for creating silicide defects.

It should be appreciated that the present invention is advantageous when applied to highly scaled semiconductor devices including MOS transistors having a gate length of 100 nm and less, or even 50 nm and less, since here an extremely low defect rate and high uniformity of the corresponding metal silicide regions is required to provide the reliability and uniformity in performance of the respective conductive lines. For example, the reliability of respective memory cells, in which a high resistance polysilicon line may result in a cell failure, may be significantly increased by reducing the silicide defects at areas of abutting polysilicon portions of inverse doping. However, unless otherwise referred to in the specification and in the appended claims, the principles of the present invention may also be readily applied to less critical semiconductor devices, thereby also significantly improving reliability and performance thereof.

Figure 2A:
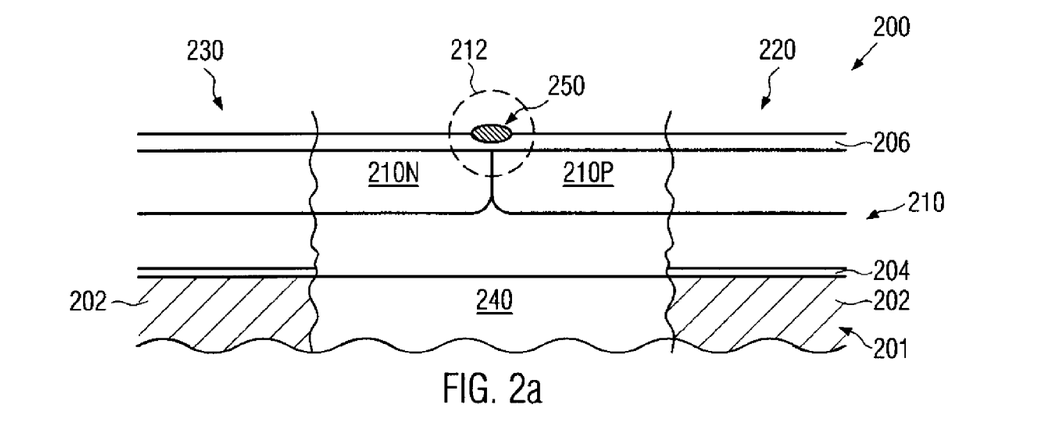
FIGS. 2a-2f schematically illustrate in cross-sectional view a polysilicon line portion including inversely doped areas as used in a semiconductor device as shown in FIG. 1a, during various manufacturing stages in accordance with illustrative embodiments of the present invention.

With reference to FIGS. 2a-2f in combination with FIGS. 1a-1c, further illustrative embodiments of the present invention will now be described in more detail. FIG. 2a schematically illustrates a sectional view of a semiconductor device 200, which may have a similar configuration as is also described with reference to FIG. 1a. The semiconductor device 200 may comprise a substrate 201 that may represent any appropriate carrier material for forming thereon an appropriate silicon-containing semiconductor layer 202, wherein the configuration of the substrate 201 and the semiconductor layer 202 may represent a "bulk" configuration, in which the semiconductor layer 202 is a part of the substrate 201, or these components may represent an SOI configuration, in which a buried insulating layer (not shown) may be provided on the substrate 201 in order to electrically insulate the semiconductor layer 202 from the substrate 201. Moreover, in this context, a silicon-containing semiconductor layer is to be understood as a material comprising a significant amount of silicon, for instance at least 50 atomic percent silicon, in order to enable the formation of metal silicide therein. Thus, the semiconductor layer 202 may comprise, in addition to usual dopant materials with the required high concentrations, additional components, such as germanium, carbon and the like, in order to provide the required characteristics of the layer 202. In and above the semiconductor layer 202, which may comprise a plurality of respective device areas that may be separated from each other by a corresponding isolation structure 240 and may be comprised of appropriate dielectric materials, such as silicon dioxide, silicon nitride and the like, respective circuit elements may be provided. For example, the semiconductor device 200 may include a first transistor element 220 formed in and on a respective portion of the semiconductor layer 202 and may also comprise a second transistor 230 formed in a different area of the layer 202. It should be appreciated that the first and second transistors 220 and 230 may represent any appropriate circuit element of an advanced semiconductor device that may be connected by a polysilicon line. For instance, the first and second transistors 220, 230 may have substantially the same configuration as is also described with reference to FIGS. 1a and 1b. For example, the transistors 220 and 230 may represent respective transistors of a static RAM cell, wherein, in typical designs, six transistors may represent a memory cell for storing one bit of information. In this case, the various transistors may be connected by one or more common polysilicon lines, such as a line 210, which is shown in FIG. 2a so as to connect the transistors 220 and 230 and also acting as a respective gate electrode of these transistor devices. Thus, in the first and second transistors 220 and 230, the polysilicon line 210 may be formed on a respective gate insulation layer 204, which may not be formed above the isolation structure 240, when an oxidation process may have been used for forming the gate insulation layers 204. In other cases, the gate insulation layer 204 may also be formed on the isolation structure 240. Moreover, in the manufacturing stage as shown in FIG. 2a, the polysilicon line 210 may comprise a highly doped portion 210N, which may for instance comprise a high concentration of an N-type dopant, while a second portion 210P may be inversely doped when the transistors 230 and 220 may represent an N-channel transistor and a P-channel transistor, respectively. Furthermore, a capping layer 206, for instance a silicon dioxide liner, may be formed on the polysilicon line 210 and also on other exposed areas of the semiconductor layer 202.

The semiconductor device 200 as shown in FIG. 2a may be formed on the basis of substantially the same process sequence as previously described with reference to FIGS. 1a-1d. As previously explained, it is believed that, in particular at an area 212, i.e., in the vicinity of the interface between the highly doped portions 210N, 210P, an increased probability exists for creating any irregularities or contaminants 250, the creation of which may be correlated with preceding implantation processes, such as the implantations 107N and 107P as described with reference to FIGS. 1c-1d. Although the corresponding contaminants 250 may be formed, in principle, at any portion of the polysilicon line 210 in respective drain and source regions of the transistors 220, 230 during the implantation of P-type dopants and N-type dopants, respectively, it is believed that an increased probability exists at the area 212 due to the masking scheme used for the implantations 107N, 107P. Since the corresponding contaminants 250 may significantly change their characteristics when exposed to elevated temperatures as are typically used for activating dopants, i.e., temperature well above 600° C., in one illustrative embodiment, the capping layer 206 may be removed prior to any high temperature processes in order to efficiently reduce the size and/or the number of contaminants 250 on and within the capping layer 206.

Figure 2B:
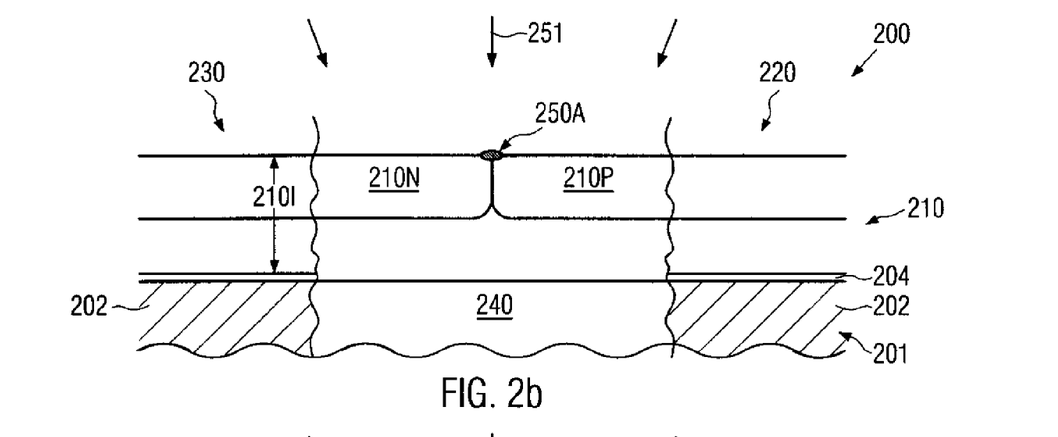

FIG. 2b schematically illustrates the semiconductor device 200 during a correspondingly designed etch process 251, in which the capping layer 206 is efficiently removed from the polysilicon line 210 and, of course, from other silicon or dielectric surface areas, such as exposed portions of the isolation structure 240 and the like, as is shown in FIG. 1b for the liner 106. During the etch process 251, the number and/or size of the contaminants 250 may be reduced, thereby resulting in a modified number and/or size of contaminants 250A. It should be appreciated that the removal of the capping layer 206 in this manufacturing stage may already provide a significant reduction of contaminants 250. In one illustrative embodiment, the etch process 251 may be designed as a wet chemical process, thereby having a high etch selectivity to underlying materials, such as polysilicon and crystalline silicon. For instance, when the capping layer 206 is substantially comprised of silicon dioxide, well-established recipes on the basis of diluted hydrofluoric acid (HF) may be used to efficiently remove the layer 206 and also to efficiently reduce the contaminants 250. In order to further remove any potential contaminants 250A from the surface of the polysilicon line 210, a further process may be initiated, during which a surface portion of the polysilicon line 210, starting from an initial thickness 2101, may be modified down to a specific depth in order to "incorporate" and/or also modify the contaminants 250A.

Figure 2C:
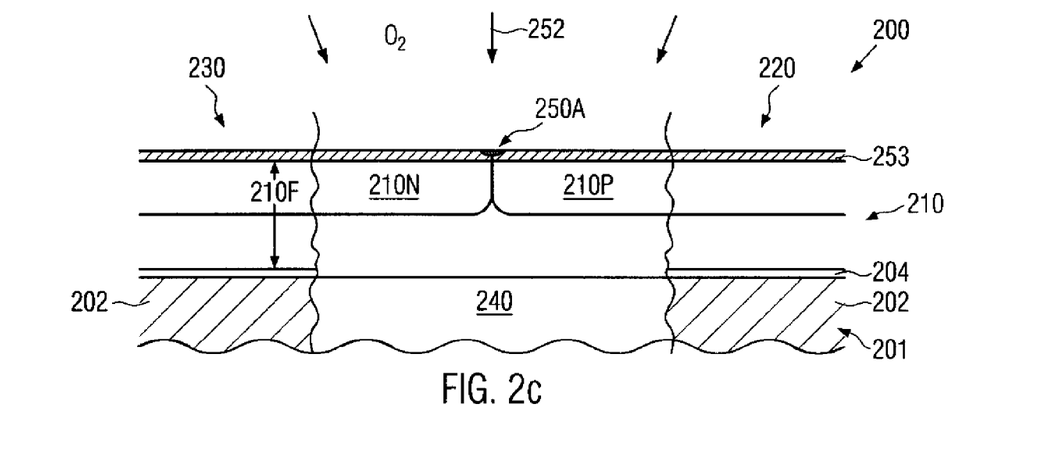

FIG. 2c schematically illustrates the semiconductor device 200 during a corresponding treatment 252 to form a sacrificial liner 253, in which the corresponding contaminants 250A may be wholly or partially incorporated. In one illustrative embodiment, the treatment 252 may comprise an oxidation process performed at temperatures that are below approximately 500° C. in an appropriate oxidizing ambient including oxygen, wherein further process parameters, such as the flow rate of additional carrier gases, the pressure and the duration of the oxidation process 252, may be adjusted in accordance with well-established recipes, since the formation of silicon dioxide is well established in the art. In some embodiments, the respective oxidizing ambient of the treatment 252 may be established as a plasma ambient including oxygen, wherein the oxidation depth may be controlled on the basis of the plasma parameters, such as excitation power, pressure, oxygen flow rate and the like. In other embodiments, a furnace process may be used to establish an oxidizing ambient for the treatment 252. In still other illustrative embodiments, the treatment 252 may comprise a wet chemical oxidation, for instance on the basis of de-ionized water containing ozone. Moreover, other wet chemical chemistries may be used for forming the sacrificial liner 253 in the form of a silicon dioxide material, as are frequently employed as efficient cleaning processes. In some illustrative embodiments, the amount of material consumption of the initial polysilicon line 210 may be controlled such that approximately 1-10 nm of the liner 210 may be consumed. Alternatively, a thickness of the capping layer 253 may range from approximately 1.5-10.0 or more nm, depending on the exact stoichiometric ratio of the oxide material in the sacrificial liner 253. In other embodiments, other "material consuming" processes may be used, such as a nitridation process on the basis of an appropriate nitrogen plasma. Consequently, the final thickness 210F of the polysilicon line 210 may be reduced by the amount of material consumed by the treatment 252. Specific process parameters for the treatment 252, for instance when comprising an oxidation process, may be established on the basis of test runs with semiconductor structures having exposed silicon-containing surface portions, which may have experienced substantially the same process history compared to the polysilicon line 210 and compared to any substantially crystalline silicon areas, such as drain and source regions of the transistors 220 and 230. It should be appreciated that, during the treatment 252, the reaction speed may be different for polysilicon material and substantially crystalline silicon material, as may be provided in the respective drain and source regions so that the capping layer 253 may have a different thickness, depending on the crystallinity of the underlying silicon-containing material. The material loss created by the treatment 252 in the polysilicon line 210 and any other silicon-containing oxidizable materials may be compensated for, if required, by appropriately re-designing the manufacturing process in order to, for instance, provide an increased polysilicon thickness prior to actually patterning the polysilicon line 210.

Figure 2D:
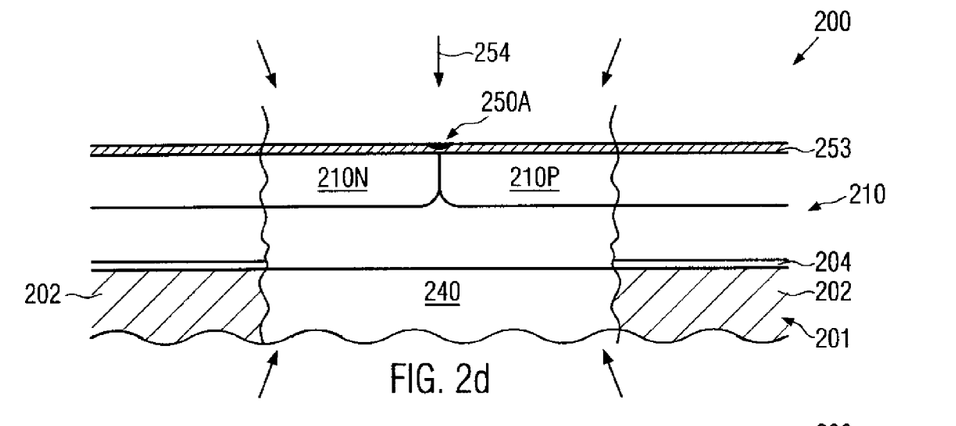

FIG. 2d schematically illustrates the semiconductor device 200 during an anneal process 254 for activating dopants in respective drain and source regions, such as the regions 131, 121 which may be formed in the transistor elements 220, 230. During the anneal process 254, which may be performed on the basis of any appropriate recipes, including, for instance, flash-based anneal processes, laser-based anneal processes, rapid thermal anneal processes and the like, the sacrificial liner 253 may protect exposed surface portions and may also have incorporated therein any residual contaminants 250A, which may have been modified during the preceding treatment or which may have been substantially completely incorporated into the layer 253. Consequently, after the annealing process 254, the sacrificial liner 253 may be efficiently removed on the basis of appropriate etch techniques, wherein, in some illustrative embodiments, when the sacrificial liner 253 is substantially comprised of silicon dioxide, highly selective wet chemical etch recipes may be used, for instance on the basis of diluted hydrofluoric acid (HF). During the corresponding removal process, the efficient "encapsulation" of any residue or contaminants 250A may allow an efficient etch attack, since the corresponding encapsulated contaminant 250A may be "under-etched" and thus also be removed during the etch process. As a consequence, the surface of the polysilicon line 210 and of any other material of the device 200 may be exposed more uniformly compared to the conventional strategy, thereby providing significantly enhanced process conditions for a subsequent silicidation process. For example, in illustrative embodiments, the removal of the sacrificial liner 253 on the basis of a highly efficient and selective wet chemical etch process may be performed as the last reactive process prior to the deposition of a refractory metal. For instance, a sputter clean process, as may conventionally be performed prior to the actual deposition process of a refractory metal, may be omitted due to highly uniform exposed silicon surfaces obtained by the preceding wet chemical etch process in order to avoid the creation of sputter-induced contaminants. In still other illustrative embodiments, any appropriate conventional silicidation sequence may be performed after the removal of the sacrificial liner 253.

Figure 2E:
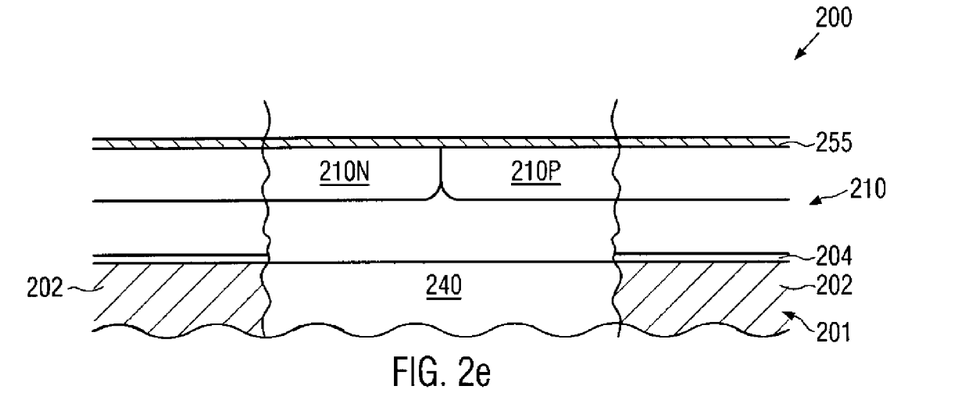

FIG. 2e schematically illustrates the semiconductor device 200 according to one illustrative embodiment in which a layer of refractory metal 255, which may comprise any appropriate metal, such as nickel, cobalt, platinum, tungsten or any combination thereof, may be formed on exposed surfaces of the device 200. Thereafter, a chemical reaction may be initiated between the material of the layer 255 and the underlying silicon or polysilicon material, wherein enhanced diffusion uniformity may be achieved due to an efficient removal of diffusion blocking contaminants, such as the contaminants 250 and 250A.

Figure 2F:
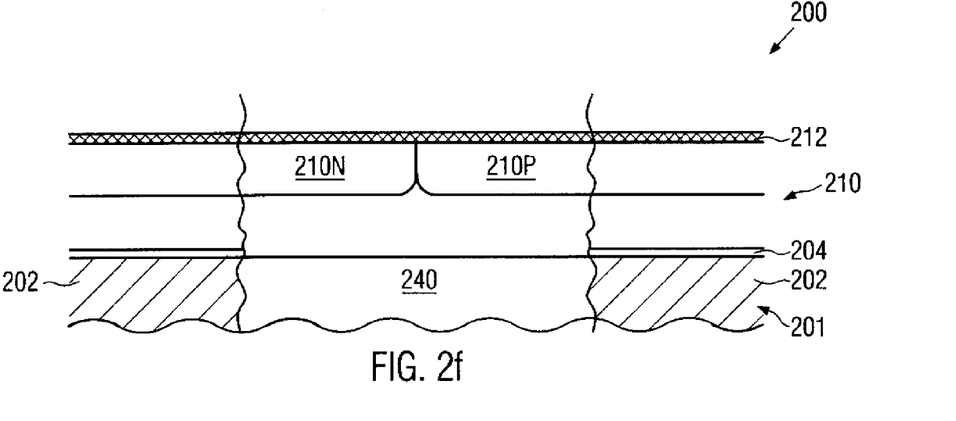

FIG. 2f schematically illustrates the semiconductor device 200 after the completion of the silicidation process. Hence, highly conductive metal silicide regions 212 are formed on the polysilicon line 210, thereby providing a low resistance connection between transistors 220 and 230.

Consequently, based on the metal silicide regions 212, an enhanced reliability of intra-level connections on the basis of polysilicon lines may be achieved due to enhanced process uniformity during a preceding silicidation process. For instance, enhanced reliability of static RAM areas may be accomplished on the basis of the metal silicide 212 having reduced defects, especially at an area in which the highly doped polysilicon portions 210N and 210P are in contact with each other.

In the illustrative embodiments described above with reference to FIGS. 2a and 2b, the capping layer 206 is removed in order to reduce in a first step the size and/or number of the contaminants 250. In still other illustrative embodiments, the capping layer 206 may be maintained and the sacrificial layer 253 (FIG. 2c) may be formed on the basis of the capping layer 206, if comprised of a material providing oxygen diffusion in an oxidizing ambient. Consequently, the sacrificial layer 253 may be formed by oxidizing a surface portion of the polysilicon line 210 through the capping layer 206, thereby increasing the thickness thereof in order to efficiently incorporate, in whole or part, the corresponding contaminations 250. For this purpose, a plasma-based oxidation process on the basis of appropriately selected process parameters may be used, wherein a process temperature may be maintained at 500° C. or less. After a desired consumption of polysilicon material is obtained, that is, after approximately 1-10 nm of polysilicon material of the line 210 are consumed, the anneal process 254 may be carried out to activate dopants in respective transistor areas. Thereafter, the combined layers 206, 253 may be removed in a common process, for instance on the basis of diluted hydrofluoric acid (HF), wherein the efficiently encapsulated contaminants 250 may also be removed, as is explained above.

As a result, the present invention provides an enhanced technique for the formation of metal silicide regions in advanced semiconductor devices in that a surface portion of exposed silicon areas, such as polysilicon lines, is modified in order to efficiently encapsulate or passivate contaminants that may have been formed during the prior processing, prior to performing any high temperature treatments, such as anneal processing for activating dopants. In some illustrative embodiments, an efficient passivation of respective contaminants may be accomplished on the basis of converting silicon or polysilicon material into oxide so as to incorporate the contaminants therein. After the high temperature treatment, the modified polysilicon or silicon material may be efficiently removed on the basis of selective etch recipes, thereby also efficiently removing any contaminants. In still other illustrative embodiments, an initially formed capping layer may be removed prior to the high temperature treatment and subsequently a sacrificial liner material may be formed by consuming exposed polysilicon or silicon material, for instance on the basis of oxidation, which may then be used as a protective layer during the high temperature treatment. Thereafter, the sacrificial layer may also be effectively removed on the basis of appropriately designed selective etch processes. Consequently, during the subsequent silicidation process, a significantly improved process uniformity may be achieved, thereby significantly reducing the probability for creating silicide defects, in particular at locations at which inversely doped polysilicon portions abut. Thus, polysilicon line resistivity and thus reliability of respective circuit elements, such as static RAM cells, may be significantly improved.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method comprising:
forming doped areas in a silicon containing semiconductor region covered by a dielectric layer, wherein the doped areas define an interface between a first doped region and a second doped region in a continuous region of the silicon containing semiconductor region and wherein said silicon containing semiconductor region represents a polysilicon line connecting at least two field effect transistors of different conductivity types;
removing said dielectric layer;
forming a sacrificial liner on at least a portion of said silicon containing semiconductor region including said interface;
annealing said silicon containing semiconductor region to activate dopants;
removing said sacrificial liner; and
forming a metal silicide in said silicon containing semiconductor region after removal of said sacrificial liner.

2. The method of claim 1, wherein forming said doped areas comprises implanting a dopant of a first conductivity type into a first portion of said silicon containing semiconductor region while covering a second portion thereof, and implanting a dopant of a second conductivity type in said second portion while covering said first portion.

3. The method of claim 1, wherein forming a sacrificial liner comprises performing a layer formation process that consumes a surface portion of said silicon containing semiconductor region.

4. The method of claim 3, wherein forming said sacrificial liner comprises performing an oxidation process.

5. The method of claim 4, wherein said oxidation process is performed at a temperature of approximately 500° C. or less.

6. The method of claim 5, wherein said oxidation process comprises a plasma oxidation process.

7. The method of claim 4, wherein said oxidation process comprises a wet chemical oxidation.

8. The method of claim 4, wherein said sacrificial layer is removed on the basis of a wet chemical etch process.

9. The method of claim 8, wherein said wet-chemical etch process is based on hydrofluoric acid (HF).

10. The method of claim 1, wherein said dielectric layer is comprised of silicon dioxide.

11. The method of claim 1, wherein a thickness of said sacrificial liner is in the range of approximately 2 to 10 nanometers.

12. A method comprising:

forming a cap layer over a silicon containing region;

doping the silicon containing semiconductor region through the cap layer to form at least two doped regions, wherein an interface is defined between a first doped region and a second doped region in a continuous region of the silicon containing semiconductor region;

oxidizing a surface portion of said doped silicon containing semiconductor region in the presence of said capping layer to form a sacrificial liner;

removing said sacrificial liner; and forming metal silicide in said silicon containing semiconductor region.

13. The method of claim 12, further comprising annealing said silicon containing semiconductor region to activate dopants.

14. The method of claim 13, wherein said annealing is performed prior to removing said sacrificial liner.

15. The method of claim 12, wherein oxidizing said surface portion is performed at a temperature of approximately 500° C. or less.

16. The method of claim 12, wherein oxidizing said surface portion consumes a thickness of said silicon containing semiconductor regions of approximately 1 to 10 nanometers.

* * * * *